United States Patent [19]
Detaint et al.

[11] Patent Number: 5,377,615
[45] Date of Patent: Jan. 3, 1995

[54] PROCESS FOR INCREASING THE DIMENSIONS OF CRYSTALS WHICH CAN BE PRODUCED BY HYDROTHERMAL GROWTH, USING A SEED OBTAINED BY CRYSTALLINE PLATE ASSEMBLY

[75] Inventors: Jacques Detaint, Villemonble; Jacquie Schwartzel, Palaiseau; Yves Toudic, Lannion; Etienne Philippot, Saint Mathieu De Trevier; Bernard Cappelle, Villejuif; Albert Zarka, Paris; Aline Goiffon, Saint Clement La Riviere; Roger Arnaud, Crangevrier, all of France

[73] Assignees: France Telecom; Centre National de la Recherche Scientifique (CNRS), Paris, France

[21] Appl. No.: 887,088

[22] Filed: May 22, 1992

[30] Foreign Application Priority Data

May 24, 1991 [FR] France .................................. 91 06271

[51] Int. Cl.⁶ .............................................. C30B 29/14
[52] U.S. Cl. .......................................... 117/1; 117/902
[58] Field of Search ............ 156/600, 623 Q, DIG. 73, 156/DIG. 98

[56] References Cited

U.S. PATENT DOCUMENTS 2,931,712  4/1960  Thaddeuset et al. .

FOREIGN PATENT DOCUMENTS 0123809  11/1986  European Pat. Off. .
0827501   2/1960  United Kingdom .
2079175A  1/1982  United Kingdom .

OTHER PUBLICATIONS

J. Crystal Growth, vol. 71, No. 1, Feb. 1, 1985 pp. 269-272, Amsterdam, NL Aqueous Solution Growth Of KDP From "Spliced" Seeds; Berdui et al.

"Lattice Distortion & Parameter Variation In Quartz and Berlinite Crystals:Methods For Improving the Quality"; Zarka et al., Proceeding 1992 IEEE Freq. Control Sym.

"Recent Results In Study of Piezoelectric Resonators by X-Ray Topography Using Synchrotron Radiation"; Capelle et al; 4th European Freq. & Time Forum Neochapl 13-14 Mar. '1990.

"Mode Shape Analysis Techniques Using Synchrotron X-Ray Topography"; Capelle et al; 44th Annual Symposium or Frequency Control 23-25 May '1990.

"Stroboscopic X-Ray Topography of Quartz Resonators"; Capelle et al; 43rd Annual Frequency Control Symposium 31 May 1 & 2 Jun. '1989.

*Primary Examiner*—R. Bruce Breneman
*Assistant Examiner*—Felisa Garrett
*Attorney, Agent, or Firm*—Blakely, Sokoloff, Taylor & Zafman

[57] ABSTRACT

The present invention relates to a process for increasing the dimensions of quartz crystals and of quartz-isomorphic materials, which can be produced by hydrothermal growth from seed, in which a seed obtained by assembly of several crystalline plates is used, wherein there are assembled at least two plates of strictly identical lengths and/or widths and of similar thicknesses, cut in at least one crystal and having, on at least three faces crystalline orientations, the deviations from which remain, between the plates, smaller than about 10" of arc, and wherein said plates are brought together on a support by guidance elements, thus ensuring their alignment on the aforementioned three faces while maintaining crystalline orientation deviations smaller than about 10" of arc, one face per plate being left free for growth of the assembled seeds, leading to the production of a single crystal exhibiting at least one dimension greater than that corresponding to the original crystalline plate.

The subject of this invention is also to the crystals obtained by this process.

17 Claims, 6 Drawing Sheets

PROCESS FOR INCREASING THE DIMENSIONS OF CRYSTALS WHICH CAN BE PRODUCED BY HYDROTHERMAL GROWTH, USING A SEED OBTAINED BY CRYSTALLINE PLATE ASSEMBLY

The present invention relates to a process making it possible to increase the dimensions of quartz crystals and of quartz-isomorphic materials which can be produced by hydrothermal growth from seed crystal, in which a seed obtained by assembly of several crystalline plates is used. More specifically, this process makes it possible to increase the dimensions in particular in the crystalline directions exhibiting very low growth velocities.

Quartz and quartz-isomorphic metallic phosphates or arsenates possess in common the property of being piezoelectric materials endowed with very attractive properties which result for many of them from very similar structures. The alpha phase structure of these materials is indeed derived, in first approximation, from that of alpha quartz, by substituting one silicon atom out of two by an aluminum or gallium atom and the remaining silicon atoms by phosphorus or arsenic. The analogues which have been most studied to this day are aluminum phosphate AlPO4 (berlinite) and gallium phosphate GaPO4.

The relevance of quartz in electronics is now well known for obtaining stable oscillators and for making filters; it stems basically from the stability as a function of temperature and in time of the resonance frequencies and from the very high Q-factor of quartz resonators.

The relevance of quartz analogues is the possibility of obtaining frequency stabilities and Q-factors similar to those obtained with quartz while possessing more intense piezoelectric properties which make it possible to make filters having much mere substantial relative bandwidths as well as oscillators which can be much more frequency shifted than those using quartz. (1) (2) (3) (4).

More and more, the manufacture of surface waves as well as bulk waves devices, using this material, tends to be carried out with collective techniques on slices of 75 or 100 mm diameter. Obtaining such slices presupposes the use of very large seeds, the production of which the assembly is more attractive since the cost of very large natural crystals is very high and since the latter must be renewed fairly frequently to maintain a high crystalline quality.

Berlinite, the alpha phase single crystal of aluminum phosphate (AlPO4), is, among the isostructural compounds of quartz the one the state of development of which is the most advanced at the present time. It has the attraction of making it possible to obtain filters twice as large and oscillators twice as shiftable as those using quartz, while also having orientations leading to a very high thermostability of the resonance frequencies.

For this material as well as for quartz, a major difficulty is to obtain crystals of large size making it possible to produce devices using this material in economically attractive conditions.

Gallium phosphate has piezoelectric properties twice as intense as berlinite (and four times as intense as quartz). This material is in the process of being developed in several laboratories and crystals of sufficient size (centimeter) to make devices have been obtained. Here again, however, the question arises now of obtaining crystals of even larger size.

I.1 OBTAINING QUARTZ CRYSTALS AND QUARTZ-ISOMORPHIC ANALOGUES

I..1.1 Obtaining Quartz Crystals

Several processes for quartz hydrothermal growth are known (5) (6). They use alkaline solutions of sodium carbonate or of sodium hydroxide. In these solvents quartz solubility is direct (it increases with temperature) so that the nutrient placed in the lower, hotter (of the order of 400° C.) part of the autoclave dissolves in the form of silicate; the saturated solution is carried by convection towards the cold part (temperature typically lower by about 50 degrees than the preceding value) where it desaturates by depositing quartz on the seeds. Conditions of temperature, of pressure (charge), the concentrations and if appropriate the additives used, control the growth velocity and the quality of the material produced. Conditions which lead to a pure material (low content in OH and Al) are those where high temperatures and pressures and modest velocities (some tens of mm per day and per face) are prevalent. These conditions are also those which lead to a low dislocation density (as long as the seed itself contains only a few).

I.1.1.2 Obtaining High Quality Berlinite Crystals

Known natural crystals of this material are of very small size (mm). Crystals of significant size are obtained by hydrothermal synthesis, from seeds, under various conditions (pressure, temperature) and in various solvents. Several methods of hydrothermal synthesis, conventional or not, are used to recrystallize a saturated solution and/or a nutrient (composed of very small berlinite crystals obtained by synthesis) on the seeds. They involve techniques compatible with the retrograde solubility of this material in all the known solvents (slow rise in temperature of a saturated solution, inverse vertical gradient method, horizontal gradient method, composite gradient method and methods using mechanical transfers of saturated solvent). The initial studies used as solvent phosphoric acid in the range of temperature 150°–190° C. (7) (8) (9) (10), then, it appeared that the use, in the same range of temperature, of hydrochloric acid (11) (12) or of mixtures of phosphoric and hydrochloric acids (13) (14), led to a certain improvement in crystal quality. However, the Q-factors of the resonators made with crystals obtained under all these conditions were substantially inferior to what is desired with regard to applications.

It has been shown that these modest Q-factor values were, as for quartz, linked to the presence of hydrogen impurity, hydrogen being indicated by the presence of OH radicals detectable by infrared spectroscopy (15) (16), by electron microscopy (water precipitation) (17) (18), by dielectric constant measurements and, of course, by Q-factor measurements of resonators (19) (20). Important and rapid progress in the purity and crystalline quality of the material were then obtained thanks to substantial modifications of the growth conditions which consisted in a first phase in using much higher growth temperatures (up to 280° C. (21)); then in combining the use of high temperature with that of a new solvent: sulfuric acid (22) (23) (24). The latter growth conditions make it possible simultaneously to obtain crystals with high Q-factors and with sufficiently high velocities in the usual directions (z and x).

These growth conditions are at present those which make it best possible to obtain crystals of sufficient quality for the applications (Q-factor-crystalline quality), under conditions permitting industrial production (they can be implemented in metallic autoclaves of large size). With these growth conditions, growth velocity in one of the simple crystallographic directions (y axis) is substantially lower (by about an order of magnitude) to those, relatively similar, observed in the two directions x and z (24). There also exist several slow growth directions in particular in the directions inferred from crystal symmetries of [0$\bar{1}$2] and [1$\bar{0}$2]. This leads to the formation of natural faces perpendicular to these orientations (faces pi' and pi) and to a crystal morphology relatively similar to that of synthetic quartz crystals, with for AlPO4 produced under these conditions, replacing of the [0$\bar{1}$1] faces (the so-called "z" and [1$\bar{0}$1] ("r") faces) by the [0$\bar{1}$2] (pi) faces; while growth processes carried out at low temperature in other solvents need to have above all the faces inferred from [0$\bar{1}$1] and [1$\bar{0}$1].

I.1.3 Obtaining Crystals of Other Quartz Analogues

Gallium phosphate is soluble in phosphoric acid but with a few differences with berlinite (25) (26) so that, given some modifications concerning concentrations and temperatures, the processes of AlPO4 hydrothermal growth in phosphoric medium can be transposed to the GaPO4 case (25) (26) (27). Special growth methods or methods using berlinite as a seed have been developed (28) (29).

Aluminum arsenate can also be produced using the same techniques and arsenic acid as solvent (30).

I.2 OBTAINING CRYSTALS HAVING OPTIMAL SHAPES FOR APPLICATIONS

For quartz as well as for its analogues, the common crystalline orientations which are the more attractive for applications, are the sections AT, BT and ST which are so-called Y rotated orientations, derived from that (the so-called Y section) of the plane defined by the ternary axis (the so-called z axis) and a crystal binary axis (x axis) by a simple rotation around this binary axis. The most important is the AT section (close to Y−33° for berlinite (31)). To obtain plates having these orientations in the most favorable economic conditions, given the known techniques and technology means, the crystalline morphologies (they are similar except for a few details concerning replacing natural faces by other orientations slightly different for the whole family of quartz analogues) which are the most interesting for applications from the point of view of the cost of obtaining plates, are those of crystals obtained using:
- either seeds with an orientation normal to the original z axis (FIGS. 1a and 1b), of great length along y, and of a height, along the x axis, substantially shorter than the length. This is the most common case for quartz (FIG. 1a).
- either usually parallelepipedal seeds (FIG. 2) of an orientation normal to the electric axis x, having a substantial length along the y axis, a small thickness and a height, along the optical axis z, substantially shorter than the length. This is the most common case for berlinite (FIG. 2).
- either still, but at present less frequently, seeds having the orientation of the natural faces 0$\bar{1}$1 (FIG. 4) or 1$\bar{0}$1 (FIG. 3), (or also 0$\bar{1}$20 or also 1$\bar{0}$2), a width directed along the x axis and a substantial length in the y' direction (projection of the y axis onto the plate plane).

The crystals produced with 0$\bar{1}$1 germs make it possible to obtain AT, ST or BT plates with very large dimensions (slices for the collective production of piezoelectric devices), and lead to a very good material efficiency.

These crystal types are also attractive as a result of the following facts:

From a crystal having a given length along the y direction, it is possible to obtain seeds and crystals of these orientations having up to nearly a double length along y'.

The loss of length (quartz) is smaller during consecutive growth operations than with other usual orientations of seed.

These morphologies (see typical cases in FIGS. 1 to 4) make it indeed possible to obtain the individual plates or slices necessary to the manufacture of devices with the most attractive material efficiency and while minimizing the cost of the operations to be carried out. These operations are precutting, cutting, edging (if appropriate), lapping and polishing.

To minimize material losses and the cost of plate cutting operations, it is necessary that the crystals and therefore the seeds should have a substantial length (a minimum is of the order of 10 cm, the practical maximum is to the order of 50 cm) along y or y'. The optimal length is a function of the equipment used and also of the other final dimensions of the crystal.

The seeds are obtained by longitudinal cutting of crystals, most often of the types indicated above. Given the shape of the crystal endings, there is a length loss in this operation which is more important, in general, than the gain obtained during growth.

It is therefore of great relevance to have available a technique making it possible to increase substantially and rapidly the crystal length along the y direction. It is also necessary that this technique should not degrade substantially crystalline quality.

To do this, the state of the art comprises two types of technique.

II.1 GROWTH LENGTHENING METHOD

The growth velocity along the y direction, under the conditions leading to a good crystalline quality (in practical terms those are the ones which lead to a low [OH] content) is too low to make it possible to obtain significant lengthening of the crystal length.

A better possibility lies in using growth conditions leading to a more important velocity along the y direction, when satisfactory ones are known. This is not the case today for quartz, but it is particularly the case for its analogues of growth in phosphoric medium in a so-called low temperature range going from about 150° C. to 190° C. This is thus the case for berlinite, but also to a lesser extent, of growth in some other possible solvents of berlinite, in the same range of temperature.

This technique has been used by the quasi totality of authors (8) (9) (10) etc., starting from Stanley (7) for the study of metallic phosphate analogues of quartz. Its primary relevance is moreover to make it possible from spontaneous nucleations to obtain the first crystals of a given material. The technique has made it possible to obtain berlinite crystals having lengths along the y axis up to about 4 cm.

However, this technique has three major disadvantages:

- It leads to crystals very rich in OH impurity, with a concentration of the order of 1000 ppm for berlinite, which possess as a result crystalline parameters slightly different from those of high purity crystals. This fact leads to having to carry out intermediate growth under conditions leading to a progressive reduction in OH impurity contents to obtain satisfactory results with regard to crystalline quality.
- It requires a lot of time. Very numerous successive growth operations would be required to obtain the useful lengths wanted along y. For this reason it is very poorly suited to obtain the large number of large seed essential for a substantial production.
- The great number of successive growth operations required can lead to a substantial degradation in crystalline quality (substantial probability for the formation of dislocations at each growth restart, and possibly of twin crystals).

II.2 LENGTHENING METHOD BY CRYSTAL ASSEMBLY

This technique has been the object of research ever since practically the beginning of studies on the producing of synthetic quartz crystals. In fact, the very large natural crystals making it possible to obtain the substantial seed lengths necessary are rare and costly. Several methods of crystal assembly have been suggested for lengthening the quartz seeds, one having been specified for berlinite. All rely on the assembly before growth of plates with a crystalline orientation as identical as possible by a device avoiding all the relative orientation variations between two plates during growth and able to withstand corrosion in the medium used for growth.

a) In the fifties, the Clevite company has suggested two processes for lengthening seeds of the "Y rod" type [plate lengthened along the y axis slightly thinner in the z direction than in the x direction] (32) (33). With these processes, the similarity in orientation of the plates to be assembled is essentially obtained by sawing these plates out of the same block, with a multiblade saw, which according to the authors should ensure sufficient accuracy in the orientations. The end faces of the rods to be assembled are obtained in a single sawing operation which should, according to these authors, ensure crystalline orientation identity.

In one of the processes (32), the seeds are assembled by mechanical clamping in a steel seed carrier resting on two of the lateral faces of the seeds, a layer of a yielding material (metallic silver) being laid between the seeds and the clamping device. In the other process (33), the Y rods are assembled using crystalline quartz plates held by metallic wires, the growth or dissolution of which is understood to play a role in holding the assembly. These faces of contact of the two plates to be assembled can have a orientation different from the surface perpendicular to the y axis. These authors indicate rightly only one orientation inferred from that normal to the y axis directed along the length of the rod, by a rotation (of 30 to 60 degrees according to the direction), around the optical axis in such a way that the orientation of this end face becomes normal to one of the two crystallographic axes of order 2 (other than the one perpendicular to the length of the rod).

b) More recently, I. R. A. Christie et al. (34) have suggested a process making it possible to obtain quartz seeds of great length (about 30 cm) by assembly of one or more plates. In this process, two crystalline plates, previously coated with thin metallic layers of chrome and of gold, are assembled with partial overlap over a certain length, using a soldering process by diffusion between the thin metallic layers, under vacuum and at high temperature. The seed thus obtained by assembly is grown in an autoclave according to a known process of quartz hydrothermal growth.

No details are given on the method making it possible to obtain the plates to be assembled nor on the orientation identity required nor on the relative orientation precision necessary. No indication is given on a method making it possible during assembly to achieve an extremely accurate alignment of the crystalline axes of the two plates. Indeed, even if the two plates had initially a similar orientation, the assembly process leads to a relative disorientation of the two plates by rotation along an axis perpendicular to the surface of assembly.

c) More recently yet, B. H. T. CHAI et al. (35) have suggested a process making feasible the rapid increase in size of crystals of quartz-isomorphic metallic orthophosphates ($AlPO_4$, $GaPO_4$) by assembly of plates to constitute a single seed. In the first variant of the process, the berlinite or $GaPO_4$ plates are obtained, preferably from the same single crystal, by cutting in plates perpendicular to the optical axis, these plates are placed one against the other on a support, using as lateral resting faces the natural faces r and z (these faces are those which appear during low temperature growth in the solvents used by these authors). To keep them aligned during growth, these authors use a pressing technique with fluorinated polymer parts acting on the face of the plates which is opposite to that in contact with the support. In a variant, these authors mention the possibility of using as resting face the faces cut perpendicularly to the Y axis.

The plates thus assembled are put in a horizontal autoclave in vitreous silica in which the circulation of the berlinite enriched solution is speeded up by a periodic rocking motion. The growth conditions indicated by the authors for obtaining a unique single crystal from assembled seeds are those which were then known to them (mixture of $H_3PO_4$ and of HCl under low temperature conditions and with low changes leading to very modest pressures).

The limitations and disadvantages of the method for lengthening crystals, proceeding via successive growth have been indicated above (II.1). In practical terms, this method, the implementation of which is essential in the first phases of the development of a material for which no natural seeds are available, cannot cope with obtaining the large crystals necessary for industrial applications when the growth velocity in the direction in which the increase in size is required is low relatively to those of other directions. This is the case of quartz-isomorphic metallic orthophosphates, for which the growth velocity in the y direction is very low relative to those observed in the other directions.

In the case of synthetic quartz, the extremely low value of the growth velocity along y obtained under the growth conditions known today, means that this method is without any significance whatsoever.

It has been discovered according to the present invention that the methods known today for lengthening crystals by seed assembly (II.2) are not satisfactory for the following three main reasons:

- The processes suggested and implemented for obtaining plates to be assembled do not lead to orientations sufficiently similar for the plates to be assembled.

The assembly methods suggested cannot ensure initially and/or maintain during growth sufficient accuracy on the relative orientation difference between the assembled plates.

In many of the arrangements suggested, the growth of the usable parts of the crystals thus obtained is perturbed by the device ensuring the holding together of the assembled plates.

The two first points are, in particular, of extreme importance. Indeed according to the present invention, it has been discovered that even a minimum disorientation existing between the assembled plates leads to the occurrence of crystalline defects (dislocations, twin crystals, etc.) the presence of which, in introducing zones with greater fragility and with slightly different acoustical properties, can make the crystals of little or no use. The major difficulty in this respect is therefore to determine the maximum admissible disorientation.

Taking into account the fact that the methods used for assembly can at best only preserve the orientations, and therefore can only increase the relative disorientation existing between plates, it is necessary that those should have initially orientations technically as identical as possible. Our experiments have shown that the orientation accuracies of the plates before assembly must be greater by at least an order of magnitude than the values generally accepted and which are those to which lead the methods proposed in the prior art (from half a minute to several minutes of arc). Indeed, the investigation of growth carried out on seeds displaying relative disorientations of the order of the minute shows that this disorientation induces a large number of crystalline defects (dislocations, twin crystals . . . ).

From this point of view, the processes using directly sawing methods to obtain plates to be assembled, including those making it possible to obtain simultaneously several crystalline plates, lead to angular dispersions which are not admissible in this application (of the order of one to sometimes several minutes of arc). Similarly, the assembly process must not introduce additional errors in the orientation identity of the plates, including under conditions prevailing during growth.

All in all, from the point of view of the initial orientation accuracy of the plates as well as from that of the inaccuracies introduced during assembly, the prior art provides little satisfaction. This explains probably why the old processes are not used any more today in spite of the obvious economic advantage of having such methods available.

In the process described in II.2 a), using mechanical clamping by steel and silver parts ensuring lateral guidance on a small portion of the plate length cannot ensure the preservation of a very high positioning accuracy under the conditions of temperature existing during growth as a result of the very large dilatation differential existing between quartz and the metals used. For the variant using quartz parts, the dilatation of the silver wire used for the positioning of the latter has the same disadvantages.

In the process described in II.2 b), to provision making it possible to align the axes located along the length of the seeds is mentioned.

In the process described in II.2 c), the angular precision specified for the plate preparation ($\pm 0.05$ to $\pm 0.01$ degree) is insufficient to obtain a direct satisfactory growth under conditions leading to a low OH impurity content. In this case the formation of a single crystal without fractures cannot be obtained with an acceptable efficiency. It appeared indeed that when the OH impurity concentration is reduced, to obtain the properties required for applications (high Q-factor), the possibility of obtaining satisfactory growth on seeds displaying zones with disorientations of this order of magnitude, is reduced and then disappears. These considerations on the slight possibility given by crystals obtained under "good" growth conditions to accommodate low angular disorientations (including those which appear naturally between different growth sectors as a result of different impurity contents), explain also why it is necessary to make use of higher orientation accuracies.

The fact of arranging the plates with a lateral hold on natural growth faces does not guarantee in any way a low relative orientation deviation between the plates (error for rotation around an axis perpendicular to the assembly plane) because the natural faces considered (r and z faces of the rhombohedron) are rarely strictly level and they usually display between them an angular deviation of the order of one to several minutes of arc. The blade holding system is only adapted to growth in horizontal autoclaves operating at relatively low temperatures (using a fluorinated polymer). The growth conditions described lead to obtaining berlinite crystals very rich in OH impurities (from several hundreds of ppm to about a thousand according to the growth velocity), these crystals have too low Q-factors and temperature coefficients too large by two or three orders of magnitude to be used for the production of devices.

Another disadvantage of several of the methods suggested up to now is that crystalline growth in the directions meant to be used is perturbed by the presence of the device designed for ensuring plate positioning during growth. This is particularly the case of the methods described in II.2 a) in which a part of the support and the silver wire are situated in the main and useful growth direction, and of that described in II.2 c) in which the fluorinated polymer parts are located also in the growth direction.

The subject of the present invention is a process making it possible to increase the dimensions of quartz crystals and of quartz-isomorphic materials via hydrothermal growth, by making and using a seed obtained by assembly of several parts having crystalline orientations as identical as possible.

More specifically, the subject of the present invention is a process for increasing the dimensions of quartz crystals and of quartz-isomorphic materials which can be produced by hydrothermal growth from seed, in which a seed obtained by assembly of several crystalline plates is used, wherein use is made of at least two plates of strictly identical lengths and/or widths and of similar thicknesses cut in at least one crystal, and having, on at least three faces crystalline orientations the deviations from which remain, between the plates, smaller than about 10" of arc and wherein said plates are brought together on a support by guidance elements ensuring their alignment on the aforementioned three faces while maintaining crystalline orientation deviations smaller than about 10" of arc, one face per plate being left free for growth of the assembled seeds, leading to the production of a single crystal exhibiting at least one dimension greater than that corresponding to the original crystalline plates. The support and the guidance elements ensure therefore the holding of said plates once they have been brought together.

In one embodiment, said plates are assembled using a device consisting of:
  a planar support against which one of said three faces is applied, and
  two parts for lateral guidance with a plane surface acting jointly with the two other faces of said three faces in a clamping mode, said support and said parts for lateral guidance ensuring thus the positioning of said plates.

Of course, the flatness of the planar support and the rectilinear character of the seed contacting faces of the lateral guidance parts must be conform to the angular accuracy aimed at by the present invention.

The present invention makes it possible to obtain, with high efficiency and high crystalline qualities, large crystals of these materials which are necessary to obtain under favorable economical conditions the piezoelectric devices used in electronic equipment.

The present invention provides a process which meets better than those known previously the requirements from a practical viewpoint, in particular in that it removes to a great extent the disadvantages linked to the insufficient similarity in crystalline orientation of the plates to be assembled, those linked to the loss of orientation similarity caused by the device ensuring the assembly of these plates or due to the influence of crystalline growth conditions (temperature, etc..) on this device, as well as those linked to distortions caused by the presence of parts of this device in the useful growth zones.

In one particular embodiment, said crystalline plates have forms inscribed in a parallelepiped so that they consist of six main faces which are parallel two by two and perpendicular to each of the three main directions corresponding to the width, the length and the thickness of the parallelepiped
  four faces of which, perpendicular two by two to the thickness on one hand and to the width or to the length, preferably to the width, on the other hand have orientation deviations among them, two by two in the same plate on one hand, and from one plate to the other on the other hand, smaller than about 1041 of arc, and
  the two other faces, respectively perpendicular to the length or to the width, preferably to the length, having deviations among them for the same plate and from one plane to the other up to about 5' of arc,
  the two faces perpendicular to the length or to the width, preferably to the width, being guided and held by said parts for lateral guidance and positioning,
  one of the faces perpendicular to the thickness being applied onto said planar support and the other face perpendicular to the thickness being left entirely free for growth,
  said plates being assembled by those of their faces perpendicular to the length or to the width.

The process which is the subject of the invention comprises three steps which are jointly necessary to obtain the result.

III.1 The first step relates to obtaining two or more plates to be assembled. In an embodiment variant, it consists in obtaining at least two plates of strictly identical widths and of very similar thicknesses cut in the same or in several different crystals and, such that the four corresponding faces are strictly plane and parallel two by two, with better than about 10 seconds of arc for four faces, the crystalline orientation deviations being, from one plate to the other for each of these four faces with those corresponding to the other(s), smaller also than about 10 seconds of arc. In the case of quartz it is even relevant that these deviations should be reduced to less than 5 seconds of arc.

For practical reasons these plates are most often of a shape to be inscribed in a parallelepiped, and also they will most often be assembled along their length. Contrary to the prior art, it not essential that the faces perpendicular to the length display between them (and from one plate to the other) crystalline orientation deviations as low as those required for the other faces. Deviations of the order of a few minutes of arc are admissible because the orientation accuracy of these faces does not affect the orientation identity after assembly.

III.1.1 A simple and satisfactory method for obtaining such plates is the following, as represented in FIG. 5:

A parallelepipedal slab is cut in a crystal the three faces of which, one according to each of the three axes of this solid (respectively length, width, thickness), are oriented using an X-ray goniometer along the three crystallographic directions required with an accuracy of the order of the minute of arc and made rigorously flat. Using a polishing technique known in optics, the three other corresponding faces are made parallel to the first three with the required accuracy (very accurate interferometric check or length measurement).

By sawing through the thickness, the slab is divided into two plates, the sawn faces (A" and A'" in FIG. 5) are made parallel to the corresponding original faces (A and A' on the figure) with the required accuracy. If need be, other plates can then be obtained by division through the thickness of the plates already obtained according to the same method.

A marking out, such as for example that shown in FIG. 5, is carried out in order to keep the information on the directions of the crystalline axes normal to the different faces of each of the plates obtained.

This method ensures an absolute crystalline orientation identity from one plate to the other, for the lateral faces, which is a very important point for the overall accuracy.

III.1.2 Another method consists in obtaining directly, by polishing and high precision X-ray goniometer control techniques, plates having identical widths and accurate crystalline orientations (in the absolute sense) with the required deviation for at least the three faces essential to the assembly process, the other faces being oriented with less precise processes (for example of the order of one minute of arc). This technique which is substantially more delicate and longer to carry out than the preceding one, can however be useful when the different plates must be obtained from different crystals.

III.2 The second step relates to the assembly of the plates for growth. It consists in ensuring that the faces specified for growth (one per plate), have between each other a minimal orientation deviation, and in preserving as best as possible their relative orientation accuracy obtained during plate preparation. To do this, the plates are guided on three faces by parts having rigorously flat surfaces constituted by materials having preferably dilatation coefficients similar to those of the materials to be assembled. Moreover, these materials are preferably naturally incorruptible (or are made to be incorruptible) in the growth medium. The nature and the dimensions of the parts used in the support and holding device for the plates are chosen so as to obtain as rigid a system as possible. A practical embodiment is shown in FIG. 6.

In this figure, the support 1 has a rigorously plane face obtained by lapping, the deviation from perfect flatness being mandatorily compatible with the accuracy aimed for. A deviation in the order of one micrometer over a distance of several centimeters being often the tolerable maximum. The flatness of the planar support is usually of the order of 0.5 to 1 micrometer for a support measuring about 12×8 cm. This support may be made in the case of quartz of a special steel with very low dilatation of the Invar, Elinvar, Durinval type from the Imphy steelworks, for example preferably coated with a silver layer (this layer having the function of avoiding any corrosion and/or the build-up of a passivation layer on the steel which can be detrimental to accuracy. For quartz low dilatation alloys constituted of precious metals of the platinum family can also be used. In the case of metallic phosphates or arsenates, pure vitreous silica and above all crystalline quartz are very satisfactory materials. The guidance parts 2 and 3 must have rigorously flat faces for supporting the plates to be assembled. It is important that the material used for the guidance parts 2 and 3 should be the same as for part 1 and that it should have dilatations similar to those of the plates to be assembled.

In FIG. 6 it can be seen that the principle chosen makes it possible to leave one of the faces of the assembled plates entirely free for growth.

In order to avoid dissolution in the initial phase of the growth operation, and later, the growth, on the faces for supporting the plates on the holding device, which is a frequent occurrence in the prior art and which deteriorates substantially the assembly accuracy, the plates are preferably coated on these faces and also on the faces according to which they are assembled one with respect to the other, (with the same aim) with thin layers of precious metals specifically silver, gold, platinum or others. Similarly, a precious metal coating may be useful to avoid undesirable attacks and/or deposits on the fixing parts (spontaneous nucleations, passivation layers, etc..).

Due to the metallization carried out, the faces of the assembled plates opposite to each other are not in direct contact. In the case of quartz analogues, it as even possible to leave between the plates an interval of the order of five hundredths to a tenth of mm without great disadvantage. It has been observed that the presence, on these faces opposite to each other, of thin layers of precious metals or even of thicker layers (several hundredths of mm), obtained by baking of a lacquer was favorable to growth quality.

With the aim of obtaining a rigid assembly for growth, the totality of the parts making up the device (plates making up the seed and parts making up the guidance and holding support device) is held in several points, in order not to harm the assembly accuracy, with metallic layers, adhering to the materials used and obtained by the baking of lacquers based on a precious metal 4. Complementary devices for holding parts 1, 2 and 3 may be used in particular in the case of seeds of large dimensions.

These silver, gold, platinum lacquers, the use of which is known in the manufacture of piezoelectric devices, are baked at high temperature (typically 500° to 550° C. that is to say temperatures lower than that of the alpha-beta phase transition of the materials to be assembled. This baking operation has the effect of leaving a very resistant practically pure metallic layer, and of a thickness generally of the order of some tens of mm which adheres very strongly to the parts to be assembled. This method makes it possible to simplify greatly part assembly and to obtain a good behavior at the high temperatures used for growth. Gold or platinum lacquers are satisfactory in all cases, for quartz salver lacquers are more particularly mentioned. The metallic layers obtained have the property of hardly perturbing growth.

Hence preferably all the faces of the assembled plates, except those meant for growth, are coated with thin metallic layers preventing dissolution and growth, in particular of precious metals.

More particularly, the plates are secured to the support and to the device parts and if appropriate to each other by adherent metallic layers obtained by baking of a precious metal lacquer.

It will be noted that one (or the) lateral guidance part (or parts) of the device can be replaced, after accurate positioning of the plates and before growth, by lateral gluing with a thick metallic layer obtained by high temperature baking of a precious metal lacquer.

III.3 The third step relates to the growth of the assembled plates.

It is desirable to choose for this step hydrothermal growth conditions leading to a good crystalline quality. As indicated above, these conditions are also those which lead to low OH contents and therefore to high Q-factors.

For quartz, conditions leading to Q-factors greater than 2 millions (5) (6) will therefore preferably be used. For berlinite the growth conditions in sulfuric medium described in Patent FR 2,595,344 are very satisfactory for this application. For GaPO4, those described in references (26) (27) may be used.

As will be seen in the examples according to the invention, it is possible to carry out (1) a growth of the seed obtained by the assembled plates then a cutting of new plates in the single crystal obtained, and (2) a new growth of a seed obtained by assembly of said new plates, so as to obtain a progressive increase in the Q-factor of the crystals obtained by modification of the growth parameters.

The process according to the invention makes it possible to obtain crystals remarkable by their size and their purity or high Q-factor. In particular, large size berlinite crystals, specifically larger than 10 cm and of high purity with an OH impurity content lower than 30 ppm and a Q-factor greater than 750,000 at 5 MHz, can be obtained.

An original feature of these crystals lies also in the fact that they have an isometric morphology along the x and z growth axes when the size of the berlinite crystals is increased along the y direction.

For crystals for which no natural seeds exist, such as berlinite, a length along the y axis beyond a few centimeters can only be obtained using a process according to the invention.

BRIEF DESCRIPTION OF THE DRAWINGS

FIGS. 1 to 4 show examples of quartz and berlinite crystals morphology.

FIG. 2 shows the morphology of a berlinite crystal with X seed.

FIG. 3 shows the morphology of a quartz crystal with z seed.

FIG. 4 shows the morphology of a quartz crystal with r seed.

5a slab having 6 faces parallel two by two and perpendicular to each other.

5b after cutting, face A" is made parallel to face A while face A'" is made parallel to face A'.

FIG. 6 shows the assembly of a berlinite Z plate to make up a single seed. (1)=planar support, (2) and (3)=lateral guidance parts, (4)=metallic lacquer.

Figure 1A:
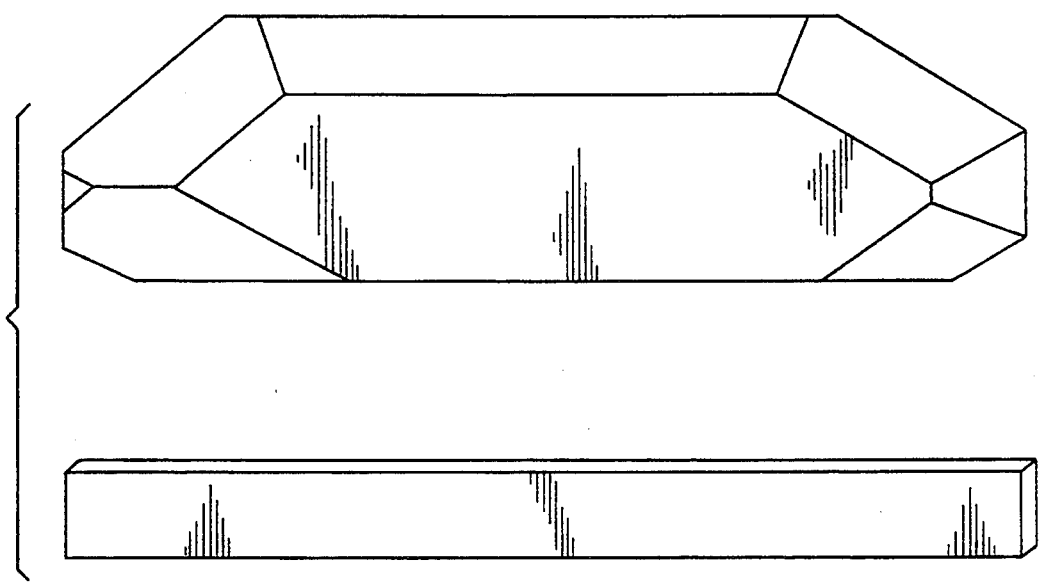
FIG. 1a shows the morphology of a quartz crystal with Z seed.
Figure 1B:
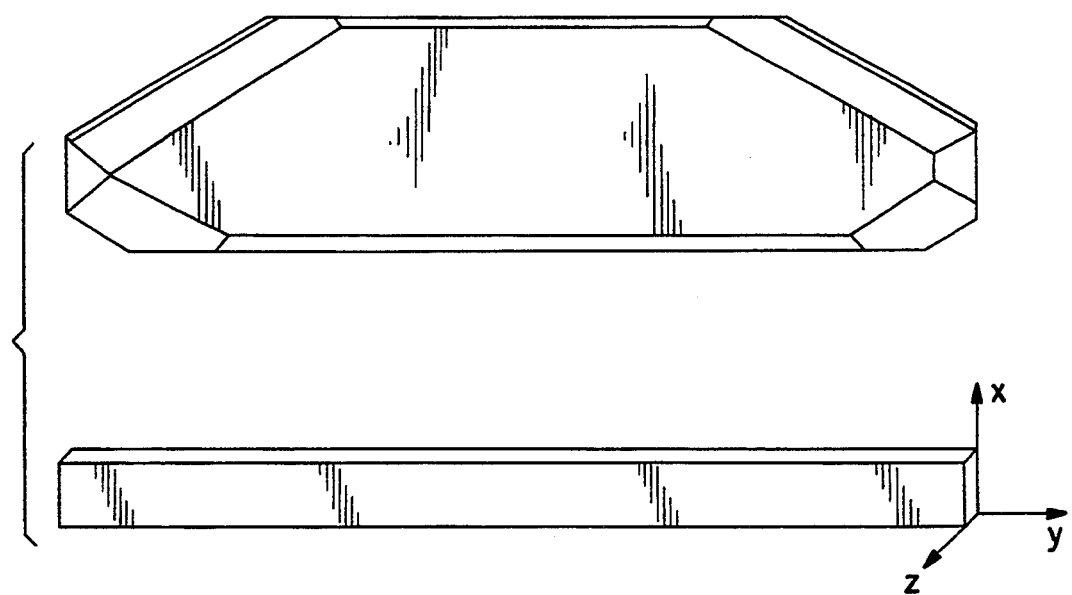
FIG. 1b shows the morphology of a berlinite crystal with Z seed.
Figure 2:
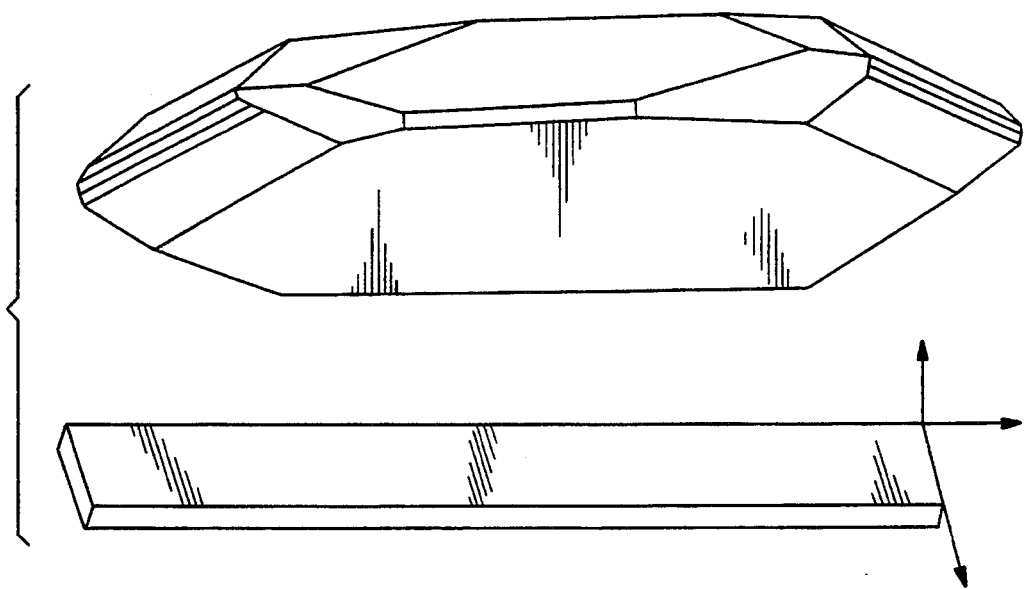
Figure 3:
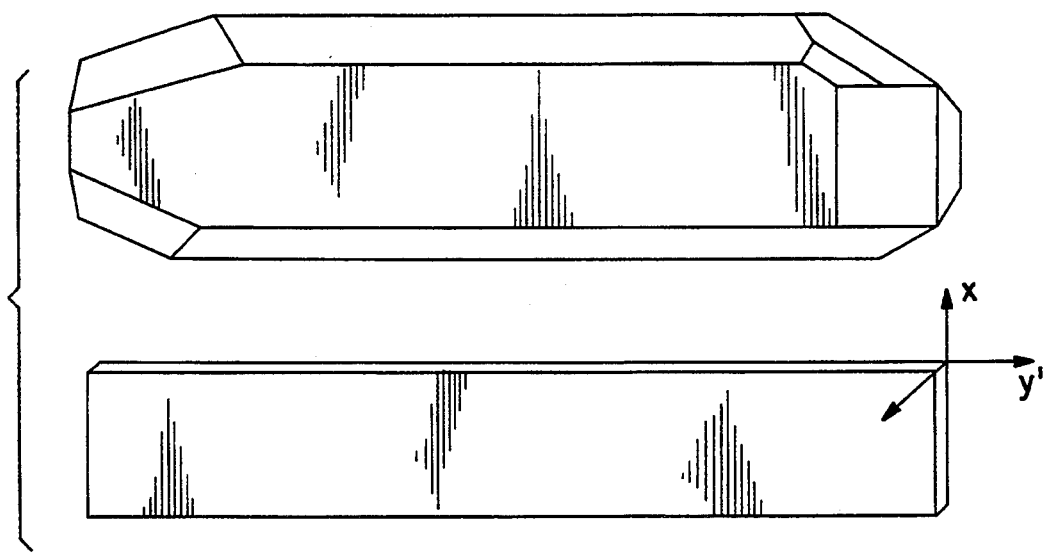
Figure 4:
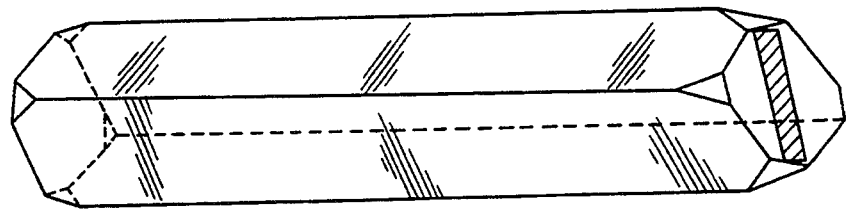
Figure 5:
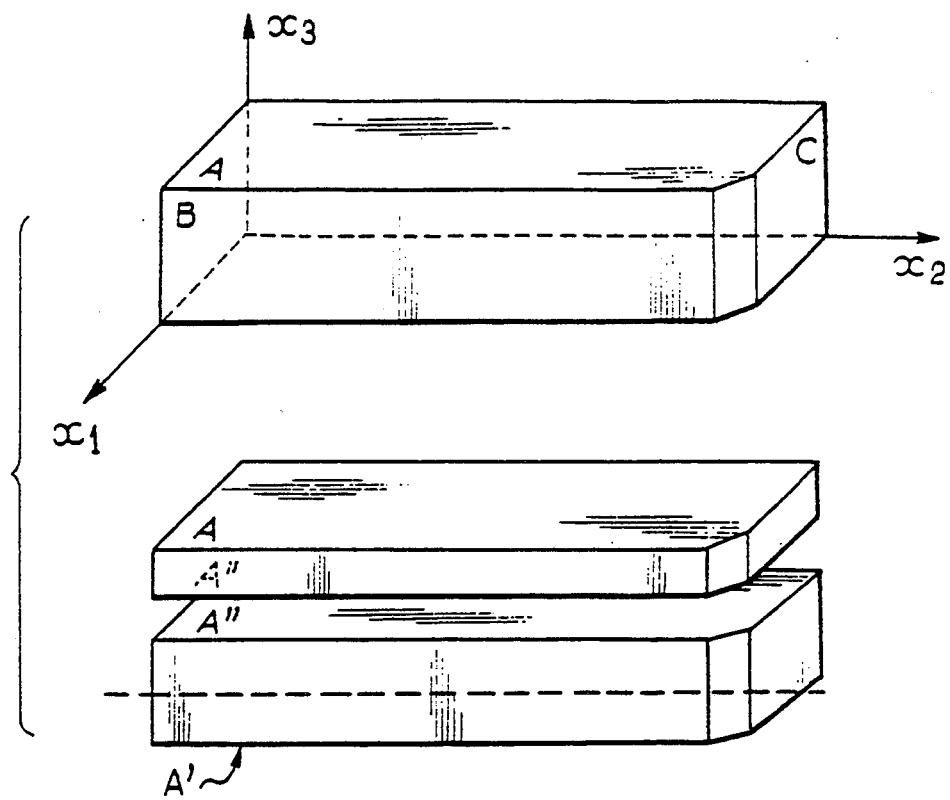
FIG. 5 shows how to obtain plates having crystalline orientations as identical as possible.
Figure 6A:
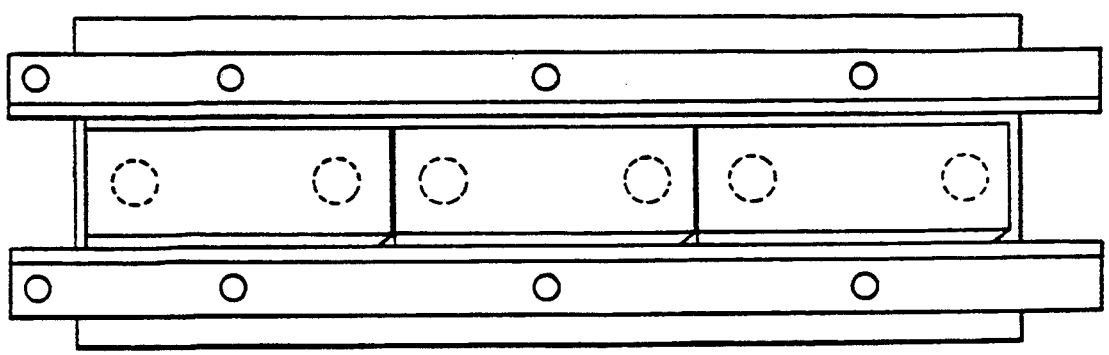

FIG. 6a shows a top view.

Figure 6B:
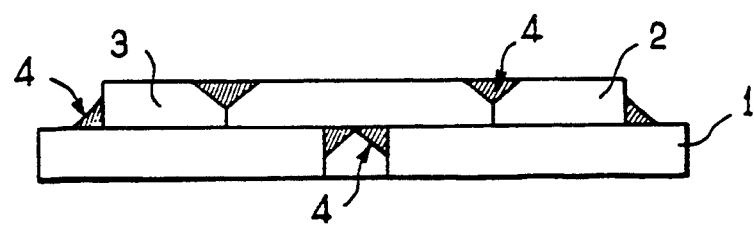

FIG. 6b shows a sectional view.

Figure 7:
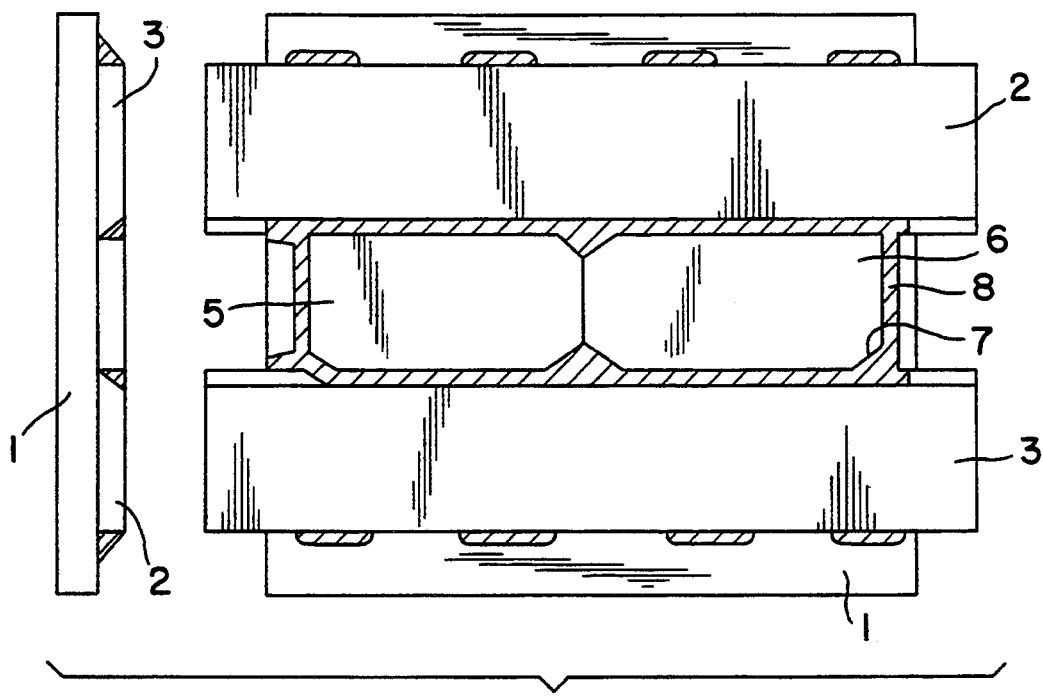

FIG. 7 (Example 1) shows the assembly of Z berlinite plates. (1)=planar support, (2) and (3)=lateral guidance parts, (5) and (6)=Z berlinite plates of identical orientation, (7)=silver lacquer, (8)=gold lacquer.

Figure 8:
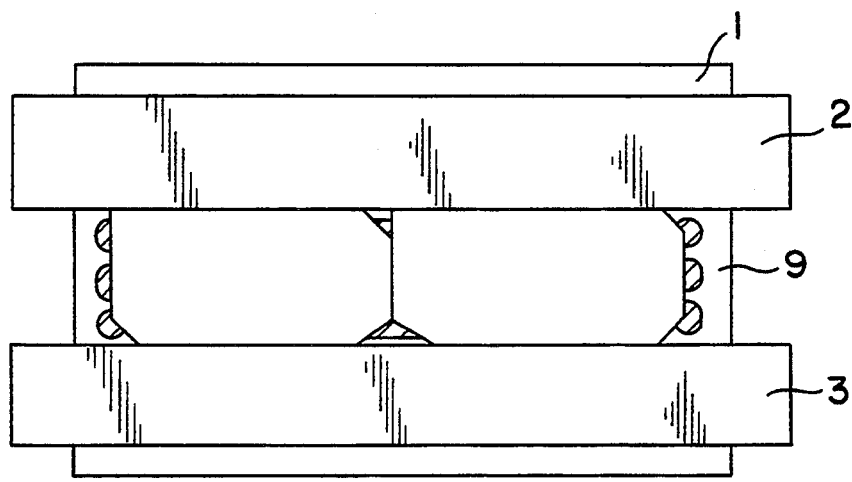

FIG. 8 shows a variant of Example 2: after alignment in the device the plates are held using a metallic lacquer 9.

Figure 9:
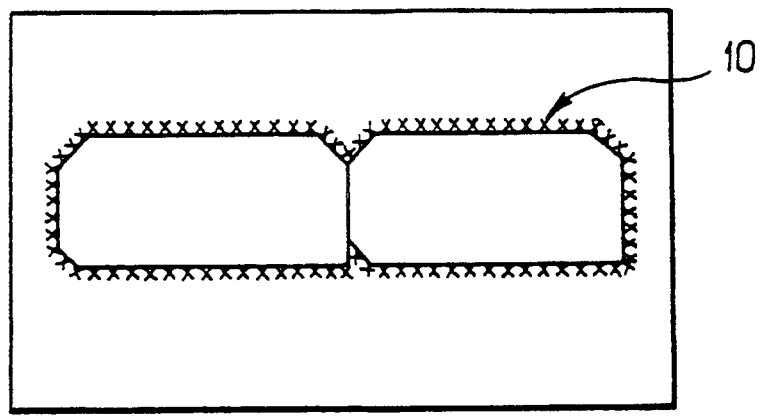

FIG. 9 shows a variant of Example 2 (continued): replacement, after assembly as per FIG. 8, of the lateral guidance parts by a metallic lacquer deposit holding them solidly on the planar support (1) and maintaining orientation identity.

Figure 10:
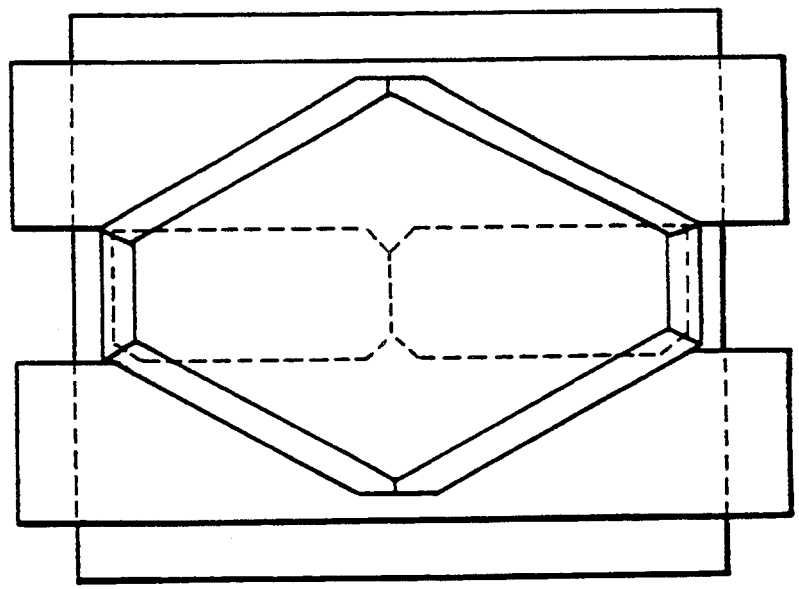

FIG. 10 shows the morphology of the crystals obtained from the device of FIG. 7.

FIG. 11 (Example 4) shows the assembly of Z quartz plates to make up a single seed.

Figure 11A:
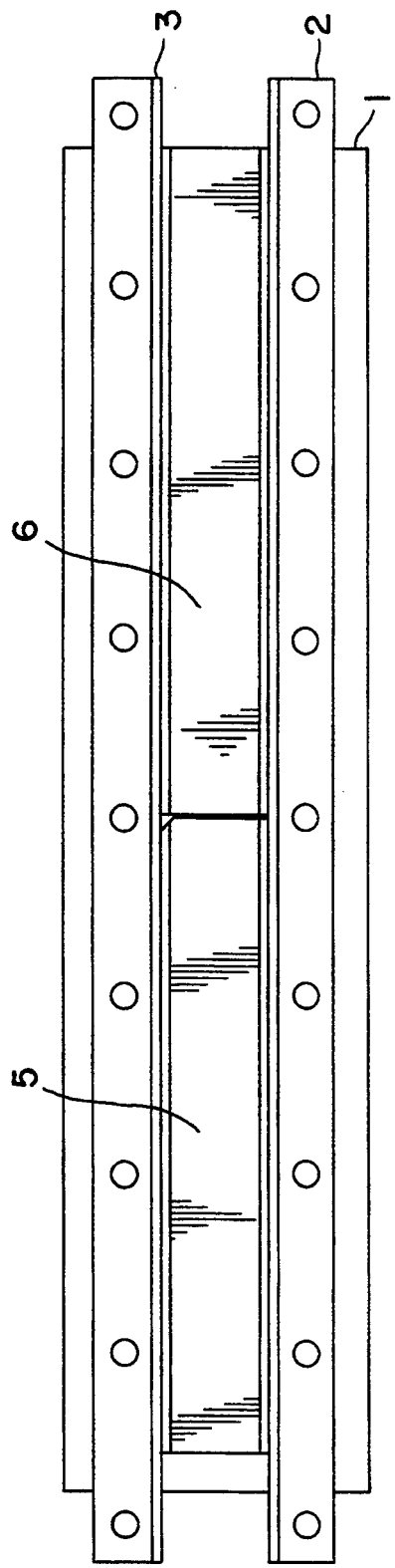

FIG. 11a shows a top view.

Figure 11B:
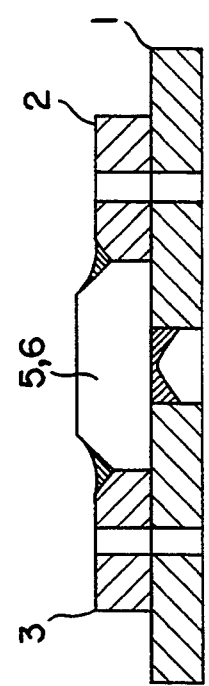

FIG. 11b shows a sectional view.

Figure 12:
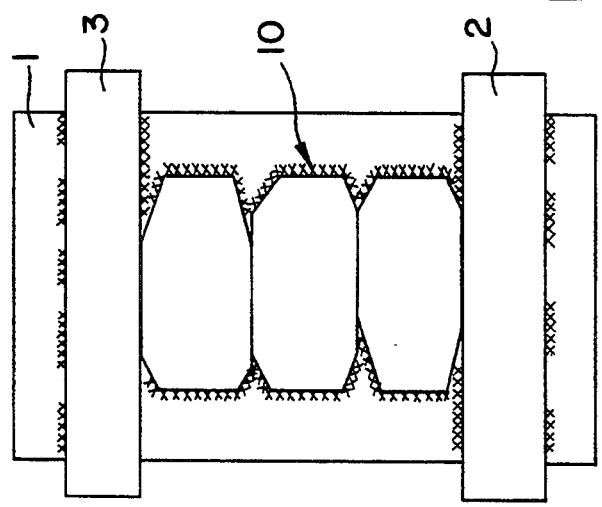

FIG. 12 (Example 6) shows the assembly of GaPO4 plates of orientation z to increase the length along the x axis.

The invention will be better understood on reading some examples given hereinbelow in a non limiting way.

EXAMPLE 1

Obtaining Large Berlinite Crystals by Assembly of Plates with an Orientation Normal to the Optical Axis (Section Z)

A slab of dimensions 0.6×3×1 cm was taken from the seed, in the growth sector +X of a crystal produced from a seed of section X by growth at high temperature in sulfuric medium. In this slab, using the technique described in III.2, two plates of identical orientation for the faces normal to the thickness and to the width were obtained (FIG. 7) with an accuracy of approximately 10 seconds of arc (that is to say a deviation from parallelism of the faces considered of the order of 1 micron over the length of 3 cm), the faces considered being polished with a deviation from flatness much smaller than 0.5 micron. The faces normal to the length were obtained by X-ray orientation on the slab, their angular deviation being lower than 2 minutes of arc. Three corners of the plates (5, 6) were cut out to make up an orientation marking (7) and also to ensure subsequently their positioning by gluing. Parts of the assembly device are in crystalline quartz of section Z, which ensures an excellent dilatation similarity: the working faces were made flat by lapping, the parts 2 and 3 having the same thickness as the berlinite plates (5, 6).

The two berlinite plates (5, 6) were metallized under vacuum on the five faces not used for growth with an underlayer of zirconium and a layer of gold of approximately 0.4 micron (8).

Plate assembly was carried out in two stages:

In the first stage, the berlinite plates were put into place so that their x and y crystallographic axes were laid out in the same direction (including sign); with the help of an auxiliary device, parts 2 and 3 were tightened against the plates ensuring thus their rigorous alignment in their plane. Having laid out at a few points (FIG. 8) a silver lacquer (9) (polyimide and silver composition) in order to maintain the rigidity of the entire device after baking, the seeds and the parts 2 and 3 were applied using a press specially designed to the support 1 in order to avoid any orientation error with respect to this plane. The totality of the device was then brought to 200° in order to bake the silver lacquer used. The latter is only meant to hold the entire device during the following stage.

In the second stage, a gold lacquer (10) bakable at 520° was laid out as indicated in FIG. 9 in order to obtain a very resistant assembly after baking.

This assembly was introduced into a vertical autoclave used for berlinite growth in sulfuric medium according to the process described in reference (22). After 8 days of growth at 210°, a single crystal having the form shown in FIG. 10 was obtained. By sawing along the quartz parts, the seed obtained by assembly can be separated from the growth (and used again). In the growth obtained X plates were cut.

These plates were subsequently grown in 4.5M sulfuric medium at 240° C. and made it possible to obtain crystals of lengths greater by about 60% than the length of the original crystal and which have a very high Q-factor making the production of resonators possible.

The process can be reiterated until the desired length is obtained.

EXAMPLE 2

Lengthening of Berlinite Crystals by Assembly of Plates with an Orientation Normal to the Z Axis Two berlinite plates of section Z with dimensions in the vicinity of 25×10×1.5 mm were obtained, as in Example 1, with extremely similar orientations using the method described at the beginning of paragraph III.1 and in the preceding example. Similarly, they were coated on 5 faces with thin zirconium and gold layers.

Assembly was carried out in two stages: the first stage is similar to that of Example 1 (FIG. 8) : in the second stage, the lateral guidance parts were replaced, one after the other, by a gold lacquer deposit bakable at 520° C. on the plate faces and on the support part 1 (FIG. 9).

The seed obtained by assembly was grown in an autoclave functioning according to the horizontal gradient principle using 6M phosphoric acid as a solvent and a crystallization temperature of 180° C. A single crystal displaying a more important expansion along the z axis than in Example 1 and a lesser lateral expansion along the x axis was obtained. This crystal was cut in X orientation plates which were used as seeds to grow crystals in 6M sulfuric medium at 210°. As in Example 1 plates cut in the latter crystals were used to obtain crystals with high Q-factor intended for the manufacture of resonators.

EXAMPLE 3

Lengthening of Berlinite Crystals by Assembly of Plates with an Orientation Normal to the x Axis Three plates of very precisely similar orientation, and of dimensions 35×10×2 mm, were obtained as indicated in paragraph III.1.1. from a parallelepipedal slab of berlinite coming from the zone +X of a berlinite crystal with a high Q-factor. Their thickness is directed along the x axis.

They were metallized on the five faces not used for growth with thin layers of platinum (1000 Å), then of gold (4000 Å). Assembly was carried out as indicated in FIG. 11. A gold lacquer was laid on the entire periphery of the plates to be assembled and on the guidance parts as indicated in FIG. 11. This lacquer was baked at 520° C. while the crystalline plates and the lateral guidance parts were pressed against the support 1. A subsequent lapping operation made it possible to obtain guidance parts and assembled plates of exactly the same thickness.

The assembly was introduced into a vertical autoclave for growth according to the inverse vertical gradient method in 4M sulfuric medium at 250° C. The single crystal obtained by growth was separated from the seed obtained by assembly via sawing then cut into plates capable of being directly used as seeds for obtaining crystals intended for the manufacture of resonators.

EXAMPLE 4

Lengthening of Quartz Crystals Along the y Direction

In a crystal of very high Q-factor and high crystalline quality, which is 22 cm long and was obtained by growth on a Z seed of 22 mm in height and displaying a growth slightly larger than 25 mm on each face of the seed, a 155×20×20 mm slab has been cut in the Z zone. The 4 large faces of this slab were made parallel and polished with a maximal error of the order of half a micron. In this slab two plates of thicknesses normal to the x axis, of width along the z axis and of length along y, of final dimensions in the vicinity of 7×150×18 mm and showing between them an orientation difference (on the four large faces) in every direction, smaller than 3 seconds of arc were obtained according to the technique described in paragraph III.1.1. These plates were etched during 5 minutes in a saturated ammonium bifluoride solution at 70° C. in order to eliminate surface defects due to polishing.

All the faces of these plates, except the +x face, were metallized by deposition under vacuum of a thin layer of Nichrome and of a silver layer of 1.5 microns.

A device using 3 guidance parts in Invar, totally coated with a metallic silver layer of about 4 microns, obtained by vacuum deposition followed by an electrolytic thickening was used for plate assembly. The working faces of these parts had previously been ground and lapped in order to achieve the flatness accuracy wanted.

In the device (FIG. 11), the crystalline plates were laid out in such a way that the face intended to experience growth should be the +x face and that the y axes should be aligned and of the same direction. Silver lacquer was deposited several times (with a baking operation after each deposition) on the chamfers provided on the assembly parts and the plates.

Growth under conditions leading to a Q-factor greater than 2.2 millions led to a single crystal of 30 cm in length which made it possible to obtain seed crystals and then crystals, of a length very much superior to those of the original crystals.

EXAMPLE 5

Increase in Height on the x Axis of Seed Crystals $1\bar{0}1$ (z face) for Obtaining a Quartz Slice of 4 Inches without Seeds From a 250×55×15 mm slab cut from one side of the seed of a seed crystal $1\bar{0}1$ (z face), two 245×50×5 mm parallelepipedal plates of similar orientation on the 4 faces (x and z) with precision better than 5 seconds of arc were prepared, etched and metallized as described in III.4. The plates were assembled along the direction of the x axis in a device of similar design and using the same material as that described in III.4. in order to obtain a single seed with a height of 100 mm along the X axis. By growth of this seed and in the second generation, it was possible to obtain crystals each making it possible to obtain 40 round slices of quartz AT or ST of 4 inches in diameter.

EXAMPLE 6

Increase of the Length along the x Axis of GAPO4 Crystals with Seeds $1\bar{0}1$ (z Face)

In a GAPO4 crystal of approximately 1 cm$^3$ in volume, having the morphology indicated in FIG. 12, a slab the thickness of which is directed along the direction $1\bar{0}1$, the width along the x axis, and the length along the y' axis defined in paragraph 2, was cut by orienting, using an X-ray goniometer one of each of the faces X and z, the faces opposite each other being obtained by setting them strictly parallel to the first faces. The natural faces existing at the ends of the slab were left.

Using the method shown in III.2, three plates of 1.2 mm in thickness and of very similar orientation were obtained, etched and metallized on the face intended to be applied to the support (FIG. 12).

The latter, as well as the lateral holding parts were made in quartz of section AT. Assembly was carried out as indicated in FIG. 12 using a polyimide lacquer with gold filler which was laid out on the periphery of the plates.

By growth according to the slow rise method between 190° and 250° C. in phosphoric medium, a single crystal of 3 mm in thickness and 20 mm along x and 15 mm along y', was obtained making it possible to obtain two seeds of orientation $1\bar{0}1$. By growth using the vertical gradient method on these seeds of crystals having dimensions of the order of 25×15×25 mm, capable of being used to obtain via a new assembly in the y' direction, a seed of a length of about 50 mm.

The subject of the invention is also crystals obtained by this process.

REFERENCE (1) Z. P. Chang, G. R. Barsch IEEE trans. Sonic Ultrason. vol 23 No. 2 p 127 (1976).

(2) J. Détaint, M. Feldmann, J. Hénaff, H. Poignant, Y. Toudic proc. 33rd Annual Symposium on Frequency Control p.70 (1979).

(3) J. Détaint, A. Zarka, B. Capelle, Y. Toudic, J. Schwartzel, E. Philippot, J. C. Jumas, A. Goiffon, J. C. Doukhan, Proc. 41st Annual Frequency Control Symposium p (1986).

(4) J. Détaint, J. Schwartzel, R. Lefevre, J. P. Aubry, L. Michel, B. Capelle, A. Zarka, E. Phillippot, Proc.

2nd European Time and Frequency Forum p 378 (1988).

(5) A. Regreny Thesis Paris VI University Jun. 20, 1973 and internal reports CNET.

(6) R. A. Laudise, R. L. Barns, IEEE trans. on Ultrasonics Ferroelectrics frequency Control vol. 35 No. 1 p 277 (1988).

(7) J. M. Stanley Industr. Eng. Chem. vol 46 No. 8 p 1684 (1954).

(8) H. Poignant, L. le Maréchal, Y. Toudic. Material Research Bull vol 14 No. 5 (1979).

(9) E. D. Kolb. R. A. Laudise J. Cryst. Growth (1979).

(10) E. J. Ozimek, B. H. T. Chai Proc. 33rd Annual Frequency Control Symposium p80 (979).

(11) J. Détaint, H. Poignant, Y. Toudic Proc. 34th Annual Frequency Control Symposium p 93 (1980).

(12) E. D. Kolb. R. A. Laudise, J. C. Grenier J. Cryst. Growth vol 50 p 504 (1980).

(13) O. Retout Thesis Montpellier University Nov. 23, 1984.

(14) B. H. T. Chai E. Buehler, J. J. Flynn U.S. Pat. No. 4,481,069 Nov, 6, 1984.

(15) R. F. Steinberg, M. K. Roy, A. K. Estes, B. H. T. Chai, R. C. Morris Proc. Ultrasonics symposium 1984.

(16) J. C. Jumas. A. Goiffon, B. Capelle, A. Zarka, J. C. Doukhan, J. Schwartzel, J. Détaint, E. Philippot, J. Cryst. Growth vol 80 p 133, (1987).

(17) J. Doukhan, B. Boulogne, Ph. Cordier, E. Philippot, Y. Toudic J. Cryst. Growth vol 84 p 167 (1987).

(18) Ph. Cordier, B. Boulogne, J. C. Doukhan Bull, Mineral. vol 111 p 113 (1988).

(19) J. Détaint, E. Philippot, J. C. JUMAS, J. Schwartzel, A. Zarka, B. Capelle, J. C. Doukhan Proc. 40th Annual Frequency Control Symposium p 234 (1985).

(20) J. Détaint, E. Philippot, B. Capelle, Y. Toudic, J. Schwartzel, J. C. Jumas, A. Goiffon, J. C. Doukhan, Proc. 2nd Frequency Control and Synthesis Symposium p 314 (1987).

(21) J. C. Jumas, A. Goiffon, Y. Toudic, J. Schwartzel, J. Détaint, E. Philippot Mat. Res. bull. vol 22 p 1063 (1987).

(22) E. Philippot, J. C. Jumas, A. Goiffon, M. Maurin, J. C. Doukhan, A. Zarka, B. Capelle, Y. Toudic, J. Détaint, J. Schwartzel French Patent 8603009.

(23) E. Philippot, A. Goiffon, J. C. Jumas, C. Avinens, J. Détaint, J. Schwartzel, A. Zarka, Proc 42nd Annual Frequency Control Symposium p 138 (1988).

(24) E. Philippot, A. Goiffon, M. Maurin, J. Détaint, J. Schwartzel, Y. Toudic, B. Capelle, A. Zarka J. Cryst. Growth to be published in 1990.

(25) H. Poignant Thesis Rennes University Oct. 25, 1979.

(26) A. Goiffon, G. Bayle, R. Astier, J. C. Jumas, M. Maurin, E. Philippot. Rev. Chimie Minérale vol 20 p338 1983.

(27) S. Hirano, K. Miwa, S. Naka J. Cryst. Growth vol. 79 p215 (1986).

(28) E. Philippot et al, French Patent 840192 Feb. 8, 1984.

(29) E. Philippot et al. French Patent 8401911.

(30) A. Goiffon, J. C. Jumas, R. Astier, E. Philippot. J. Cryst. Growth vol. 71 p763 (1985).

(31) E. Philippot, A. Ibanez, A. Goiffon, X. Buisson, R. Arnaud, B. Capelle, A. Zarka, Y. Toudic, J. Schwartzel, J. Détaint Proc. 4th European Frequency and Time Forum to be published in 1990.

(32) W. H. Charbonnet U.S. Pat. No. 2,914,389 Nov. 24, 1959.

(33) T. J. Turobinski U.S. Pat. No. 2,931,712 Apr. 5, 1960.

(34) I. R. A. Christie, D. F. Croxall, B. J. Isherwood U.S. Pat. No. 4,381,214 Apr. 26, 1983 (British Patent 8021023 Jun. 26, 1980).

(35) B. H. T. Chai; E. Buehler, J. J. Flynn, R. C. Morris U.S. Pat. No. 4,578,146 Mar. 25, 1986.

We claim:

1. A process for increasing the dimensions of quartz crystals and of quartz-isomorphic materials, which can be produced by hydrothermal growth from seed, in which a seed obtained by assembly of several crystalline plates is used;

wherein two plates identical in at least one dimension of length and width and cut in at least one crystal and having at least three faces of crystalline orientations, the deviations from which remain, between the plates, smaller than 10" of arc, and wherein said plates are brought together on a support by guidance elements, which ensures the alignment on said three faces with crystalline orientation deviations smaller than 10" of arc, one face per plate growing crystals from one of said faces thereby the production of a single crystal exhibiting at least one dimension greater than that corresponding to the original crystalline plates.

2. The process as claimed in claim 1, wherein said plates are assembled using a device consisting of:

a planar support which contacts one of said three faces, and two parts for lateral guidance each having a plane surface which contacts the other two faces of said three faces in a clamping mode, said support and said parts for lateral guidance ensuring the positioning of said plates.

3. The process as claimed in claim 2, wherein said crystalline plates are inscribed in a parallelepiped so that they consist of six main faces which are parallel two by two and perpendicular to each of the three main directions corresponding to the width, the length and the thickness to the parallelepiped, four faces, perpendicular two by two to the thickness and to one of the width and length, preferably the width, having orientation deviations among them, two by two in the same plate, and from one plate to the other, smaller than 10" of arc, and the two other faces, respectively perpendicular to one of the length and the width, preferably the length, having deviations among them for the same plate and from one plate to the other of up to 5' of arc, the two faces perpendicular to one of the length and the width, preferably the width, being guided and held by said parts for lateral guidance and positioning, one of the faces perpendicular to the thickness being applied onto said planar support and the other face perpendicular to the thickness being left entirely free for growth, said plates being assembled with their faces perpendicular to one of the length and the width.

4. The process as claimed in one of claims 1 to 3, wherein all the faces of the assembled plates, except those meant for growth, are coated with thin metallic layers, preferably precious metals, which prevent dissolution and growth.

5. The process as claimed in claim 2 wherein the plates are secured to the support and to the device parts and if appropriate to each other by adherent metallic layers obtained by baking of a precious metal lacquer on said plates.

6. The process as claimed in claim 2, wherein at least one lateral guidance part of the device is replaced after accurate positioning of the plates and before growth, by lateral gluing with a thick metallic layer obtained by high temperature baking of a precious metal lacquer.

7. The process as claimed in claim 4, wherein said precious metals are silver, gold, platium.

8. The process as claimed in claim 1, wherein the support and lateral guidance parts are constituted by materials having dilatation coefficients similar to those of the materials to be assembled.

9. The process as claimed in claim 1, wherein the crystals are crystals of quartz or of quartz-isomorphic metallic phosphate or metallic arsenate such as aluminum phosphate $AlPO_4$ or gallium phosphate $GaPO_4$.

10. The process as claimed in claim 1, wherein the size of berlinite crystals is increased along the y direction.

11. The process for increasing the dimensions of quartz crystals as claimed in claim 2, wherein the support and guidance parts are made of very low dilatation steel preferably coated with a silver layer.

12. The process for increasing the dimensions of metallic phosphate or metallic arsenate crystals as claimed in claim 2, wherein the support and lateral guidance parts are made of pure vitreous fused silica or of crystalline quartz.

13. The process as claimed in claim 1, wherein there are carried out
   (1) a growth of the seed obtained by the assembled plates, then a cutting of new plates in the single crystal obtained, and
   (2) a new growth of a seed obtained by assembly of said new plates,
   in order to obtain a progressive increase in the Q-factor of the crystals obtained by modification of growth parameters.

14. Crystals obtained by the process as claimed in claim 1.

15. The crystals as claimed in claim 14, which involve quartz or quartz-isomorphic metallic phosphate or metallic arsenate such as aluminum phosphate $AlPO4$ or gallium phosphate $GAPO4$.

16. The crystals of berlinite as claimed in claim 14, which are of large size, in particular larger than 10 cm, and of high purity with an OH impurity content lower than 30 ppm and have a Q-factor greater than 750,000 at 5 MHz.

17. The crystals of berlinite as claimed in claim 14, which have an isometric morphology along the x and z axes.

* * * * *